(12) United States Patent
Lesko

(10) Patent No.: US 6,577,187 B1
(45) Date of Patent: Jun. 10, 2003

(54) POWERED TRANSDUCER PREAMPLIFIER WITH DC LEVEL SHIFTING CIRCUIT

(75) Inventor: Matthew M. Lesko, Elburn, IL (US)

(73) Assignee: UpState Audio, Elburn, IL (US)

( * ) Notice: Subject to any disclaimer, the term of this patent is extended or adjusted under 35 U.S.C. 154(b) by 0 days.

(21) Appl. No.: 09/594,664

(22) Filed: Jun. 15, 2000

(51) Int. Cl.$^7$ .............................................. H03F 21/00
(52) U.S. Cl. ...................... 330/11; 330/69; 330/146; 330/150; 327/307
(58) Field of Search ............................. 330/11, 69, 146, 330/150; 327/307

(56) References Cited

U.S. PATENT DOCUMENTS

| | | |
|---|---|---|
| 3,595,998 A | 7/1971 | Fidi et al. |
| 3,761,831 A | 9/1973 | Foerster |
| 4,949,580 A * | 8/1990 | Graham et al. ............... 73/646 |
| 5,032,797 A | 7/1991 | Mijuskovic |
| 5,589,799 A | 12/1996 | Madaffari et al. |
| 5,748,751 A | 5/1998 | Janse et al. |
| 5,751,823 A | 5/1998 | Strickland et al. |
| 5,808,501 A | 9/1998 | Ivanov |
| 5,977,828 A * | 11/1999 | Hu et al. .................... 330/254 |

OTHER PUBLICATIONS

That Corporation, "InGenius™ High–CMRR Balanced Input Line Receiver," That 1200, 1203, 1206, pp. 1–10.
Burr–Brown® INA103, "Low Noise, Low Distrotion Instrumentation Amplifier," printed in U.S.A., Mar., 1998, pp. 1–12.
Analog Devices, "Self–Contained Audio Preamplifier," SSM2017, Analog Devices, Inc., 1997, pp. 1–8.
Jensen Transformers JT–115K–E, "Microphone Input Transformer," 8/95, pp. 1–2.

* cited by examiner

Primary Examiner—Michael B Shingleton
(74) Attorney, Agent, or Firm—Brinks Hofer Gilson & Lione

(57) ABSTRACT

A powered transducer preamplifier includes a preamplifier circuit that DC couples the preamplifier input with the preamplifier output. A biasing circuit is coupled to the preamplifier input to apply a bias voltage to power the transducer, and a DC level shifting circuit is DC coupled to the signal path of the preamplifier circuit between the input and the output to compensate for this bias voltage. The DC level shifting circuit avoids the use of reactive components, and thereby reduces phase distortion. A variety of DC level shifting circuits can be used, including a bridge circuit having four matched resistors and an inverter DC coupled between the nodes of the bridge.

51 Claims, 6 Drawing Sheets

POWERED TRANSDUCER PREAMPLIFIER WITH DC LEVEL SHIFTING CIRCUIT

BACKGROUND

This invention relates to preamplifiers for powered transducers such as condenser microphones, and in particular to such preamplifiers that directly couple the preamplifier input with the preamplifier output.

As is well known in the art, powered transducers such as condenser microphones are biased with a phantom voltage such as +48 VDC. It is customary to use a reactive component such as a capacitor or a transformer to isolate the preamplifier from the biasing voltage. Such reactive components can introduce a phase shift known as signal group delay which often varies as a function of frequency, thereby producing distortion.

The present invention is directed to an improved preamplifier for a powered transducer that substantially overcomes these drawbacks of the prior art.

SUMMARY

The powered transducer preamplifiers described below include a preamplifier circuit having a preamplifier input, a preamplifier output and a preamplifier signal path that DC couples the input and the output. A biasing circuit is coupled to the input to apply a DC bias voltage to the input, thereby powering the transducer, and a DC level shifting circuit is DC coupled to the signal path between the input and the output. This DC level shifting circuit compensates for the bias voltage by substantially or completely eliminating the bias voltage at the output.

Because the entire signal path between the preamplifier input and output is DC coupled, phase distortion associated with the capacitive and inductive components used in the prior art described above are completely eliminated.

A wide range of circuits can be used to implement the preamplifier circuit, the biasing circuit, and the DC level shifting circuit, as described in detail below. This section has been provided by way of introduction, and it is not intended to limit the scope of the following claims.

DETAILED DESCRIPTION OF THE PRESENTLY PREFERRED EMBODIMENTS

Figure 1:
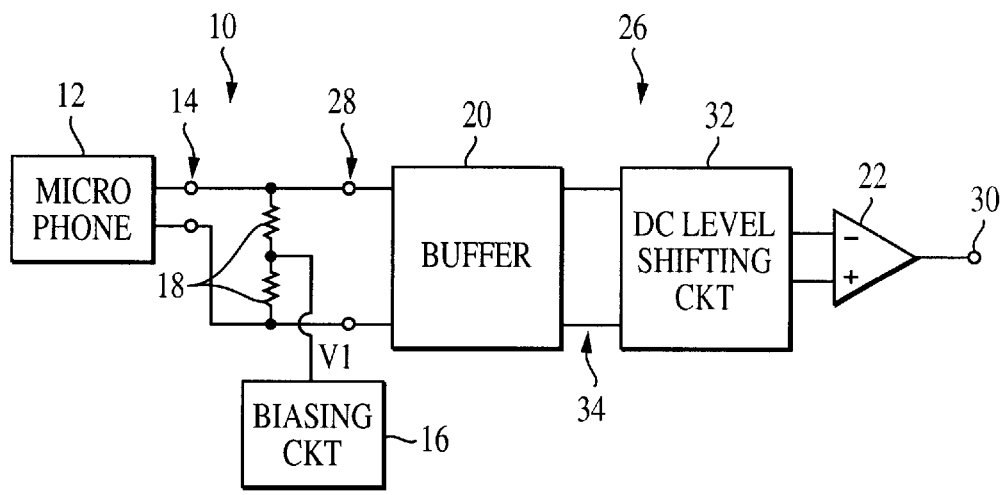
FIGS. 1, 2, and 3 are block diagrams of three embodiments of the powered transducer preamplifier of this invention.

Turning now to the drawings, FIG. 1 shows a preferred embodiment of a preamplifier 10 that incorporates a preferred embodiment of this invention. The preamplifier 10 is shown connected to powered transducer such as a condenser microphone 12 at transducer input nodes 14. A biasing circuit 16 supplies a DC bias voltage V1 to the node between two resistors 18 that are in turn DC coupled to respective ones of the transducer input nodes 14. By way of example, the bias voltage V1 can be 48 volts, 100 volts, or some other level.

The preamplifier 10 includes a buffer 20 that is DC coupled to the transducer input nodes 14 and a differential amplifier 22 that is DC coupled to the buffer 20. The buffer 20 and the differential amplifier 22 in this embodiment cooperate to form a preamplifier circuit 26 having preamplifier input nodes 28 and a preamplifier output node 30.

The elements described above can be implemented in any suitable technology using a wide variety of components. For example, any suitable powered transducer can be used in place of the microphone 12, and any suitable circuit for supplying a biasing voltage can be used for the biasing circuit 16. The buffer 20 and the differential amplifier 22 can be implemented using integrated circuits, discrete semiconductor elements, or vacuum tubes. The various nodes pointed out above have been shown for purposes of clarity, and no separate physical structure such as a connector or the like is implied by use of the term node.

In the embodiment of FIG. 1, the buffer 20 is DC coupled with the differential amplifier 22 by a DC level shifting circuit 32, which will be described in greater detail below. The function of the DC level shifting circuit 32 is to remove the DC biasing voltage from the signal applied to the differential amplifier 22. As pointed out in detail below, the signal path 34 extending between the transducer input nodes 14 and the preamplifier output node 30 is DC coupled. In this way, disadvantages associated with prior-art capacitive and inductive isolating elements are avoided.

Figure 2:
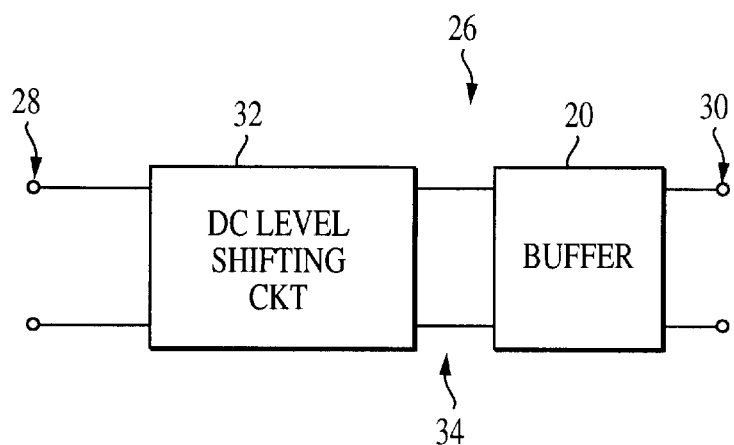
Figure 3:
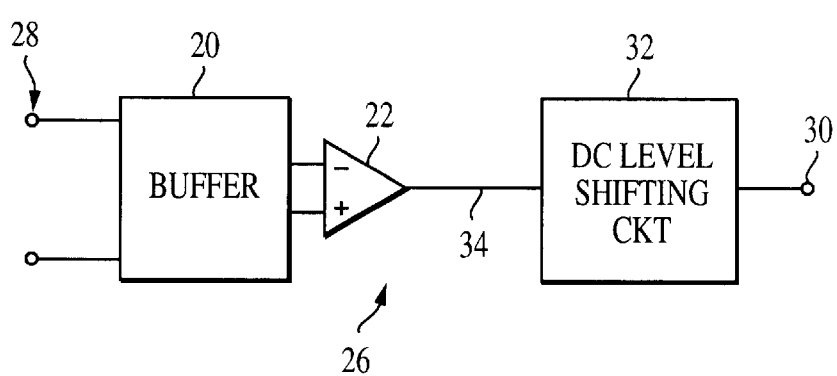

FIGS. 2 and 3 show two alternative configurations for the preamplifier 10. Though not shown, the nodes 28 of the preamplifiers of FIGS. 2 and 3 are intended to be DC coupled to a powered transducer such as the microphone 12, a biasing circuit 16 and resistors 18, all as described above in connection with FIG. 1. In the embodiment of FIG. 2, the DC level shifting circuit 32 is positioned upstream of the buffer 20, and the differential amplifier 22 is eliminated. In the embodiment of FIG. 3, the DC level shifting circuit 32 is positioned downstream of the differential amplifier 22. Many other variations are possible, including balanced configurations.

Figure 4:
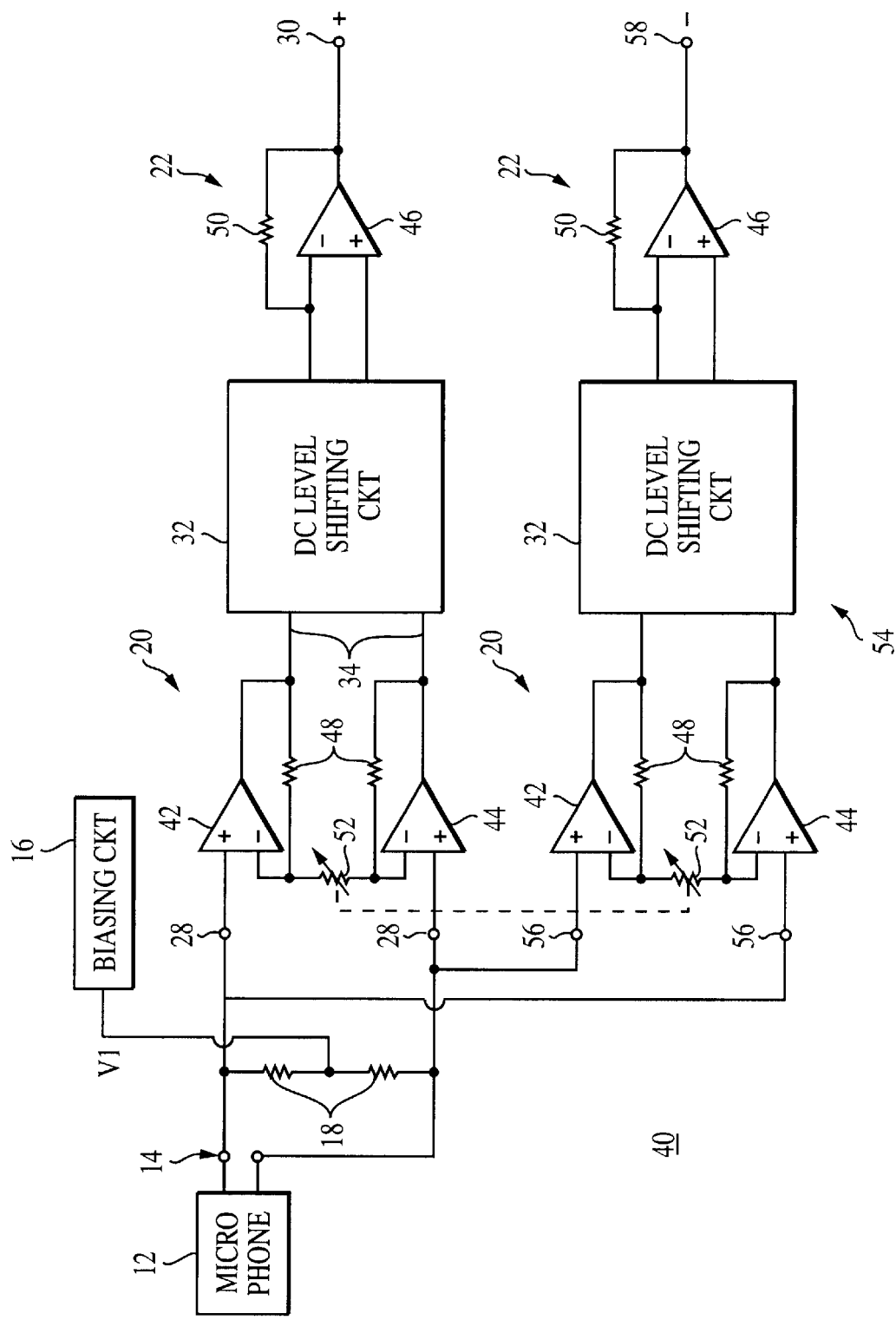
FIG. 4 is a more detailed diagram of the preamplifier of FIG. 1.

FIG. 4 shows a more detailed diagram of a balanced preamplifier 40 that is similar in many ways to the embodiment of FIG. 1 discussed above. Comparable reference numerals are used for comparable elements. In this case, the buffer 20 is implemented as a pair of integrated circuit amplifiers 42, 44, and the differential amplifier 22 is implemented as an integrated circuit amplifier 46. Feedback resistors 48, 50 are connected as shown, and a variable resistor connects the inverting inputs of the IC amplifiers 42, 44.

The preamplifier 40 of FIG. 4 is a balanced preamplifier, and it includes a second preamplifier circuit 54 including second preamplifier input nodes 56 and a second preamplifier output node 58. Note that the second input nodes 56 are connected to the transducer input nodes 14 with inverted polarity as compared with the first preamplifier nodes 28. With this arrangement, the output nodes 30, 58 provide a balanced output signal from the preamplifier 40. The variable resistors 52 are matched and ganged.

FIGS. 5–11 provide further information on a number of circuits that can be used for the DC level shifting circuit 32 of FIG. 4. The embodiment of FIG. 5 includes a bridge circuit 60 extending between first and second conductors 62, 64. The first conductor 62 interconnects the output of the amplifier 42 with the inverting input of the amplifier 46, and the second conductor 64 interconnects the output of the amplifier 44 with the non-inverting input of the amplifier 46. The bridge circuit 60 includes four resistors 66 and first and second bridge nodes 68, 70. Each of the resistors 66 connects a respective one of the bridge nodes 68, 70 to a respective one of the conductors 62, 64. An inverter 72 with a gain of minus unity is interconnected between the bridge nodes 68, 70. The conductor 64 is connected to ground by a resistor 74. The bridge circuit 60 operates to reject common mode signals on the conductors 62, 64, in effect providing a DC level shift that compensates for the bias voltage V1 introduced by the biasing circuit 16. AC signals such as the desired audio signals on the conductors 62, 64 are not affected by the bridge circuit 60. The resistors 66 connected to the node 70 are all matched in resistance, as are the resistors 76. Preferably, in each case the matching is to within 0.1%–0.01%.

Figure 6:
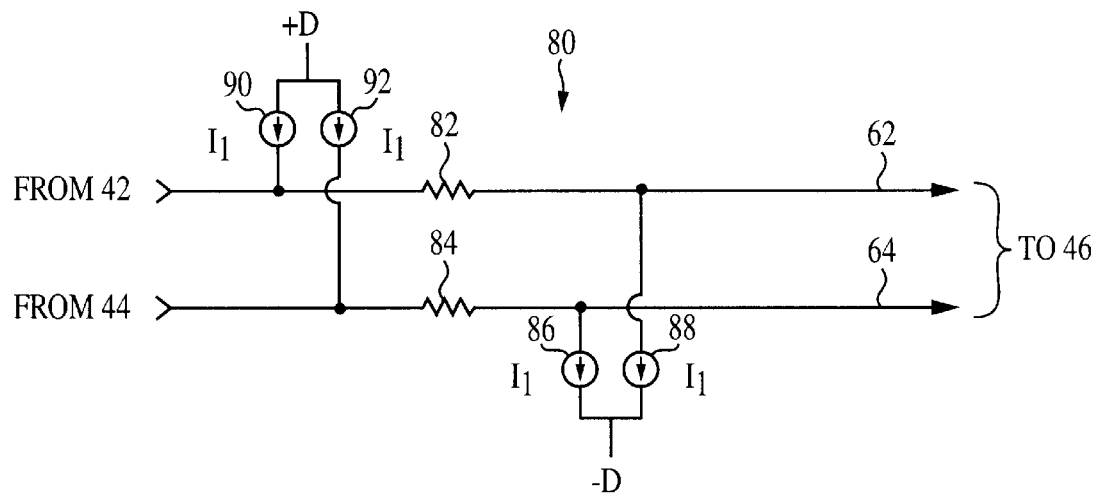

FIG. 6 shows a second DC level shifting circuit 80, including the conductors 62, 64 discussed above DC coupled to respective resistors 82, 84. Two current sinks 86, 88 are positioned in the respective signal paths downstream of the resistors 82, 84. Optionally, two current sources 90, 92 may be provided upstream of the resistors 82, 84. In this embodiment, the resistors 82, 84 are preferably matched in resistance, the current sinks 86, 88 are matched in current $I_1$, and the current sources 90, 92 are matched in current $I_1$. The resistance of the resistors 82, 84 and the amperage of the current sinks 86, 88 are selected such that the current drawn by the current sinks 86, 88 through the resistors 82, 84, respectively, creates a voltage drop that is substantially equal to the bias voltage V1 applied by the biasing circuit 16 discussed above. Thus, the resistors 82, 84 cooperate with the current sinks 86, 88 to reduce the DC voltage on the conductors 62, 64 by the bias voltage V1. The current sources 90, 92 function as a current mirror, and they are particularly useful when the buffers 20 are not able to supply the current $I_1$ drawn by the current sinks 86, 88. The various resistors may be implemented as conventional resistors, or alternately as any other elements such as transistors biased to provide a resistive impedance.

Figure 7:
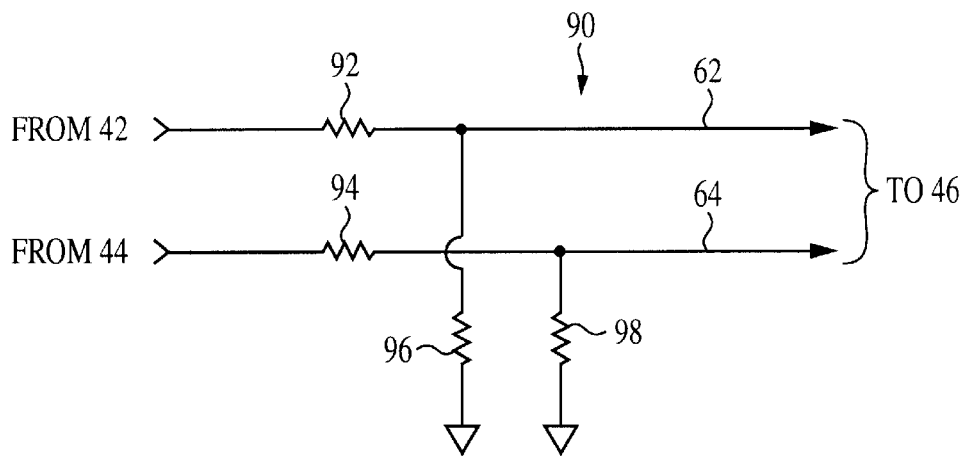

The DC level shifting circuit 90 of FIG. 7 includes a pair of voltage dividers. The first voltage divider including the resistors 92, 96 is DC coupled to the first conductor 62, and the second voltage divider including the resistors 94, 98 is DC coupled to the second conductor 64. The voltage dividers are matched, and they reduce the DC voltage applied by the conductors 62, 64 to the differential amplifier, thereby providing a DC level shifting function.

Figure 8:
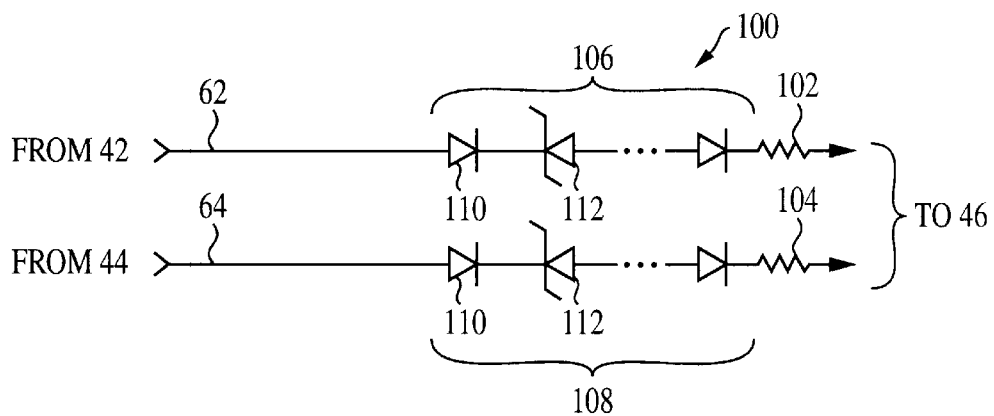
Figure 9:
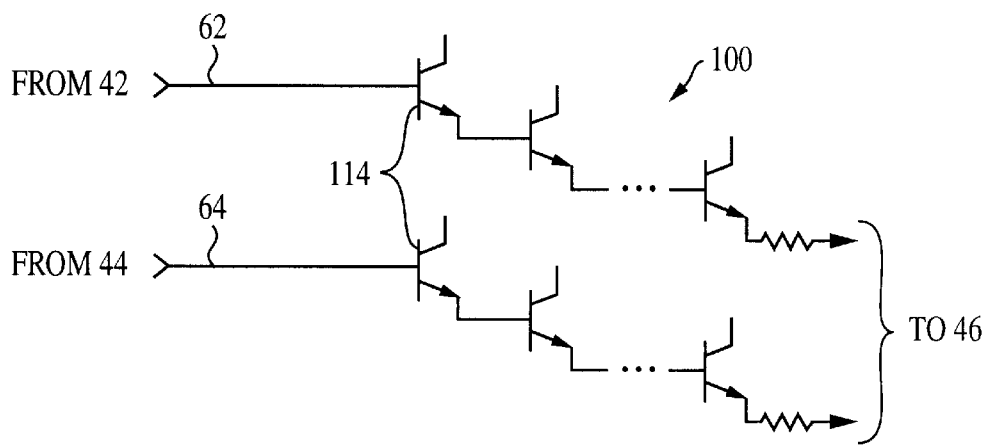

The DC level shifting circuit 100 of FIG. 8 includes resistors 102, 104 as well as two sets 106, 108 of semiconductor elements. Each set of semiconductor elements includes one or more semiconductors such as diodes 110 and Zener diodes 112. Any desired combination of semiconductor elements can be used within each set, as long as the selected elements provide the desired voltage drop across the set. In this example, the semiconductor elements are chosen to provide a voltage drop equal to the bias voltage V1 provided by the biasing circuit 16. FIG. 9 shows a variation of the DC level shifting circuit 100. In this case, each set of semiconductor elements includes one or more transistors 114.

Figure 10:
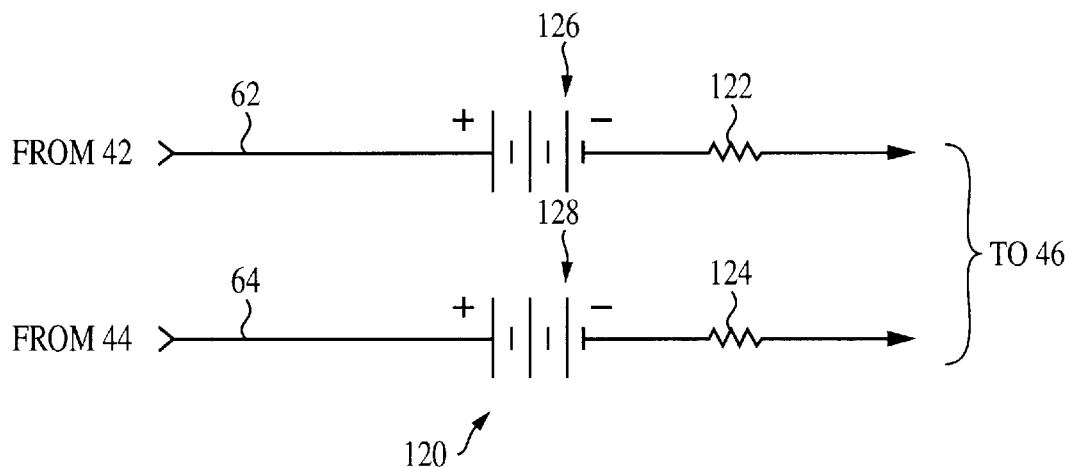

The DC level shifting circuit 120 of FIG. 10 includes matched resistors 122, 124 and matched floating batteries 126, 128 connected in series with the conductors 62, 64, respectively. The voltage supplied by the batteries 126, 128 is preferably substantially equal to the bias voltage V1, but of inverted polarity. In this way, the batteries 126, 128 reduce the DC voltage applied to the differential amplifier by an amount that is substantially equal to the applied bias voltage V1.

Figure 11:
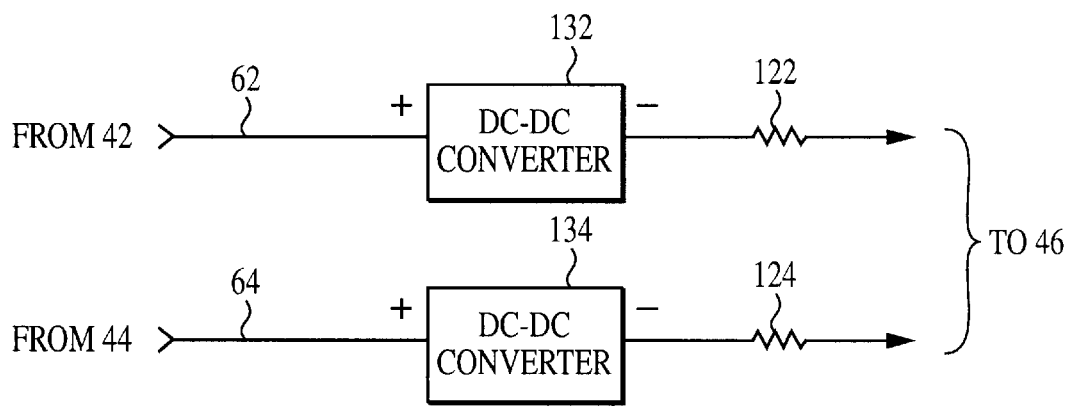

The DC level shifting circuit 130 of FIG. 11 is similar to the circuit 120 discussed above, except that the batteries are replaced with DC/DC converters 132, 134. As before, the converters 132, 134 are matched, and they provide DC voltages that substantially cancel the bias voltage V1.

Figure 12:
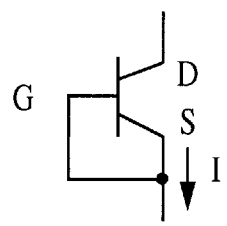
FIGS. 12 and 13 are schematic drawings of two implementations of the current sinks of FIG. 6.
Figure 13:
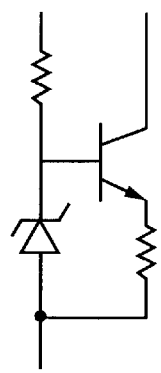

Of course, many alternatives are possible, and the foregoing preferred embodiments should be taken as examples of suitable DC level shifting circuits. The voltage sinks 86, 88 of FIG. 6 can, for example, be constructed as shown in FIG. 12 or FIG. 13. As another example, a current limited diode can be used as a current sink. Many other arrangements are possible, and these implementations are provided only by way of example.

Figure 14:
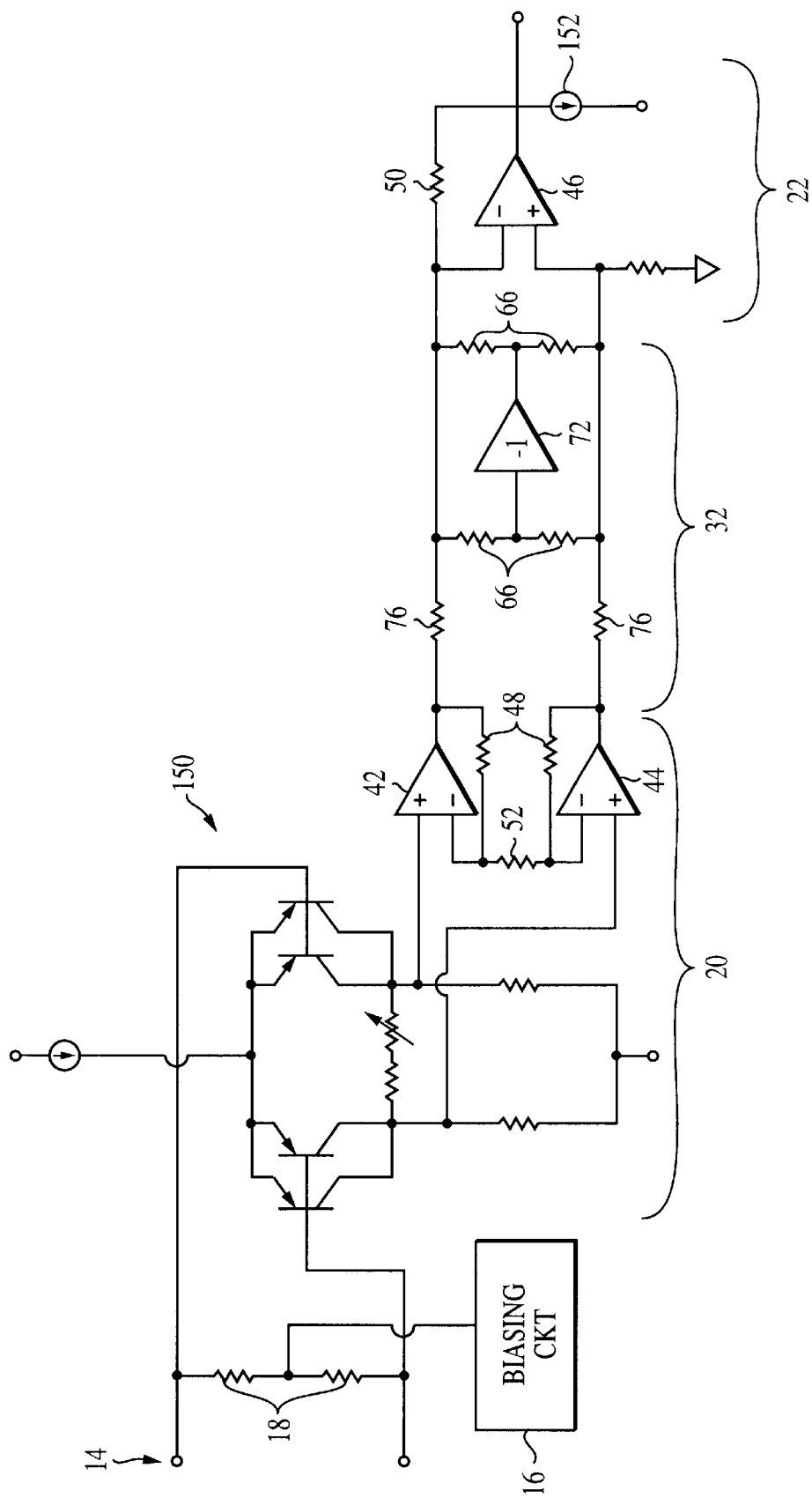
FIG. 14 is a schematic diagram of another embodiment of this invention.

FIG. 14 shows yet another embodiment of this invention. The elements 16–18 and 42–52 of FIG. 14 are similar to the corresponding elements of FIG. 4, and the elements 66, 72, 76 are similar to the corresponding elements of FIG. 5. The discussions of FIGS. 4 and 5 explain the basic operation of the circuit of FIG. 14. Additionally, the circuit of FIG. 14 includes a circuit 150 that lowers electronic noise substantially, and allows less costly, higher noise amplifiers 42, 44 to be used to achieve a given level of preamplifier performance. The circuit 150 includes a pair of transistor sets, each set including N transistors. FIG. 14 shows an example where N=2, but in general N can be any positive integer. The amplifiers 42, 44 may operate as unity gain buffers. The elements 66, 72 bias the amplifiers 42, 44 to Class A operating mode, and the current sink 152 biases the amplifier 46 to Class A operating mode.

Figure 5:
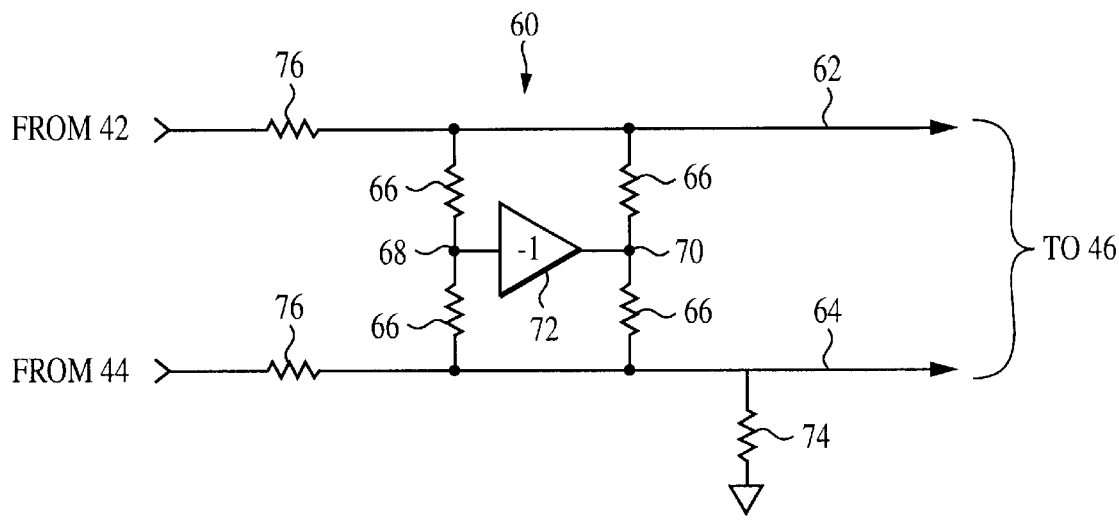
FIGS. 5, 6, 7, 8, 9, 10, and 11 are schematic drawings of alternative implementations of the DC level shifting circuit of FIGS. 1–4.

Simply by way of example, the following components have been found suitable in implementing the preamplifier of FIG. 4, using the DC level shifting circuit of FIG. 5.

TABLE 1

| Reference No. | Description | Part No. or Resistor Value (Ohms) |
| --- | --- | --- |
| 12 | Condenser Microphone | AKG 414 |
| 18 | Resistor | 6.81 K |
| 42, 44 | IC Amplifier | LT 1028 |
| 46 | IC Amplifier | OPA 604 |
| 48 | Resistor | 2.5 K |
| 50 | Resistor | 5 K |
| 52 | Variable Resistor | 5 K |
| 66 | Resistor | 250 |
| 72 | IC Inverter | OPA 177 |
| 74 | Resistor | 5 K |
| 76 | Resistor | 5 K |

It should be apparent that the preferred embodiments described above provide a number of important advantages. In each case, the preamplifier input is connected to the bias voltage that provides phantom power to the powered transducer. This bias voltage is suppressed at the output of the preamplifier, while providing all of the advantages of DC coupling between the preamplifier input and output nodes. This invention is applicable to any suitable powered microphone, including high voltage microphones requiring bias voltages of 100 VDC or more.

The DC level shifting circuit including the bridge circuit 60 brings the additional advantage that it operates as a current bias network (matched current sink), causing the amplifiers that drive the bridge network to operate as Class A rather than Class B amplifiers. This reduces or eliminates crossover distortion and improves the sonic performance of the amplifiers 42, 44 of FIG. 4.

The entire signal path of the preamplifier is free of transformers and capacitors. For this reason, signal group delay, i.e., phase shift due to reactive components, has been minimized if not eliminated. Circuit components can be chosen to eliminate slew rate limiting in the audio band, thereby reducing or eliminating transient intermodulation distortion. The preamplifier of this invention can be powered from AC voltage sources and DC voltage sources and is suitable for both fixed and portable (including remote location) applications.

As used herein, the term "DC coupled" means direct coupling via conductors, resistors, semiconductor elements, vacuum tubes, and/or other components that pass DC voltages and do not produce the substantial frequency-dependent phase shifts characteristic of capacitively coupled and inductively coupled circuits.

The term "compensate for" means to remove at least a substantial portion of a signal such as a DC bias voltage. Complete cancellation is not required, and a DC level shifting circuit that removes 48 VDC±5 VDC or more is said to compensate for a bias voltage of 48 VDC.

The term "set" means one or more.

The term "signal path" is intended broadly to encompass both balanced and single signal paths.

The term "resistor" means one or more circuit elements that provide an impedance that is substantially resistive. One or more conventional resistors and various properly-biased transistors are intended to be encompassed.

The foregoing detailed description has described only a few of the many forms that this invention can take. For this reason, this detailed description should be taken as illustrative rather than limiting. It is only the following claims, including all equivalents, that are intended to define the scope of this invention.

What is claimed is:

1. A powered transducer preamplifier comprising:
    a preamplifier circuit comprising a transducer input, a preamplifier output, and a preamplifier signal path that DC couples the input and the output;
    a biasing circuit coupled to the input to apply a bias voltage to the input; and
    a DC level shifting circuit DC coupled to the signal path between the input and the output and operative to compensate for the bias voltage.

2. The invention of claim 1 wherein the preamplifier circuit comprises a buffer and an amplifier downstream of the buffer.

3. The invention of claim 2 wherein said DC level shifting circuit DC couples the buffer to the amplifier.

4. The invention of claim 1 further comprising a condenser microphone DC coupled with the transducer input.

5. The invention of claim 1 wherein the DC level shifting circuit is operative to shift DC voltage in the signal path by an amount substantially equal to the bias voltage and opposite in polarity.

6. The invention of claim 1 further comprising:
    a second preamplifier circuit comprising a second preamplifier signal path that DC couples the input and the output; and
    a second DC level shifting circuit DC coupled with the second signal path between the input and the output and operative to compensate for the bias voltage.

7. The invention of claim 6 wherein the second preamplifier circuit comprises a second buffer and a second amplifier downstream of the second buffer.

8. The invention of claim 7 wherein the second DC level shifting circuit DC couples the second buffer to the second amplifier.

9. The invention of claim 6 further comprising a condenser microphone DC coupled with the transducer input.

10. The invention of claim 6 wherein the DC level shifting circuits are operative to shift DC voltage in the respective signal paths by an amount substantially equal to the bias voltage and opposite in polarity.

11. The invention of claim 1 wherein the DC level shifting circuit comprises:
    at least one resistor DC coupled with the signal path; and
    at least one current sink DC coupled with the signal path downstream of the resistor.

12. The invention of claim 1 wherein the DC level shifting circuit comprises:
    a bridge circuit DC coupled with the signal path, said bridge circuit comprising first and second bridge nodes, two first resistors DC coupled with the first bridge node, two second resistors DC coupled with the second bridge node, and an inverter DC coupled between the bridge nodes.

13. The invention of claim 1 wherein the DC level shifting circuit comprises a voltage divider DC coupled with the signal path.

14. The invention of claim 1 wherein the DC level shifting circuit comprises a set of semiconductor elements DC coupled with the signal path to provide a selected DC voltage drop across the set.

15. The invention of claim 14 wherein the set comprises at least one diode.

16. The invention of claim 14 wherein the set comprises at least one Zener diode.

17. The invention of claim 14 wherein the set comprises at least one transistor.

18. The invention of claim 1 wherein the DC level shifting circuit comprises a battery DC coupled with the signal path.

19. The invention of claim 1 wherein the DC level shifting circuit comprises a DC/DC converter DC coupled with the signal path.

20. The invention of claim 1, wherein the preamplifier circuit comprises a buffer, and wherein the DC level shifting circuit is positioned in the signal path upstream of the buffer.

21. The invention of claim 1, wherein the preamplifier circuit comprises a buffer, and wherein the DC level shifting circuit is positioned in the signal path downstream of the buffer.

22. The invention of claim 2 wherein the DC level shifting circuit is positioned in the signal path upstream of the amplifier.

23. The invention of claim 2 wherein the DC level shifting circuit is positioned in the signal path downstream of the amplifier.

24. A powered transducer preamplifier comprising:
    first and second transducer input nodes;
    a biasing circuit operative to apply a bias voltage to both of the transducer input nodes;
    a preamplifier circuit comprising a preamplifier output node and first and second preamplifier input nodes DC coupled with the first and second transducer input nodes, respectively, said transducer input nodes and preamplifier circuit included in a preamplifier signal path that DC couples the transducer input nodes and the preamplifier output node;

at least one resistor DC coupled with one of the nodes in the signal path; and at least one current sink DC coupled with signal path downstream of the resistor.

25. The invention of claim 24 wherein the current sink creates a voltage drop across the resistor selected to compensate for the bias voltage applied by the biasing circuit.

26. The invention of claim 24 wherein the at least one resistor comprises first and second resistors DC coupled with respective ones of the input nodes, and wherein the at least one current sink comprises first and second current sinks DC coupled with the signal path downstream of the first and second resistors, respectively.

27. The invention of claim 26 wherein the first current sink creates a voltage drop across the first resistor substantially equal to the bias voltage, and wherein the second current sink creates a voltage drop across the second resistor substantially equal to the bias voltage.

28. The invention of claim 26 wherein the first and second resistors are substantially equal in resistance, and wherein the first and second current sinks draw substantially equal currents.

29. The invention of claim 26 wherein the preamplifier circuit comprises a buffer DC coupled between the transducer input nodes and the resistors.

30. The invention of claim 29 wherein the preamplifier circuit additionally comprises a differential amplifier.

31. The invention of claim 26 further comprising:

a second preamplifier circuit comprising third and fourth preamplifier input nodes DC coupled with the second and first transducer input nodes, respectively;

third and fourth resistors DC coupled with the third and fourth preamplifier input nodes, respectively; and third and fourth current sinks DC coupled with the third and fourth preamplifier input nodes downstream of the third and fourth resistors, respectively.

32. The invention of claim 31 wherein first, second, third and fourth current sinks create substantially equal voltage drops across the first, second, third and fourth resistors, respectively.

33. The invention of claim 31 wherein the first, second, third and fourth resistors are substantially equal in resistance, and wherein the first, second, third and fourth current sinks draw substantially equal currents.

34. The invention of claim 32 wherein the equal voltage drops are substantially equal to the bias voltage.

35. The invention of claim 24 further comprising a condenser microphone DC coupled with the transducer input nodes.

36. A powered transducer preamplifier comprising:

first and second transducer input nodes;

a biasing circuit operative to apply a bias voltage to both of the transducer input nodes;

a preamplifier circuit comprising first and second preamplifier input nodes DC coupled with the first and second transducer input nodes, said preamplifier circuit comprising first and second balanced signal paths;

a bridge circuit comprising first and second bridge nodes; first and second resistors DC coupled between the first signal path and the first and second bridge nodes, respectively; third and fourth resistors DC coupled between the second signal path and the first and second bridge nodes, respectively; and an inverter DC coupled between the first and second bridge nodes.

37. The invention of claim 36 wherein the first, second, third and fourth resistors are substantially equal in resistance.

38. The invention of claim 37 wherein the inverter has a gain of −1.

39. The invention of claim 36 wherein the preamplifier circuit comprises a buffer.

40. The invention of claim 39 wherein the preamplifier circuit additionally comprises a differential amplifier.

41. The invention of claim 36 further comprising:

a second preamplifier circuit comprising third and fourth preamplifier input nodes DC coupled with the second and first transducer input nodes, said second preamplifier circuit comprising third and fourth balanced signal paths, respectively;

a second bridge circuit comprising third and fourth bridge nodes; fifth and sixth resistors DC coupled between the third signal path and the third and fourth bridge nodes, respectively; seventh and eighth resistors DC coupled between the fourth signal path and the third and fourth bridge nodes, respectively; and a second inverter DC coupled between the third and fourth bridge nodes.

42. The invention of claim 41 wherein the first, second, third and fourth resistors are all substantially equal in resistance, and wherein the fifth, sixth, seventh and eighth resistors are all substantially equal in resistance.

43. The invention of claim 41 wherein both of the inverters have a gain of −1.

44. The invention of claim 36 further comprising a condenser microphone DC coupled with the transducer input nodes.

45. A powered transducer preamplifier comprising:

a preamplifier circuit comprising a transducer input, a preamplifier output, and a preamplifier signal path that DC couples the input and the output;

a biasing circuit coupled to the input to apply a bias voltage to the input; and a DC level shifting circuit DC coupled to the signal path between the input and the output and operative to compensate for the bias voltage, the DC level shifting circuit comprising non-reactive circuit elements configured to maintain an input portion of the preamplifier circuit in Class A operation and avoid signal phase shift, whereby crossover distortion of the input portion of the preamplifier circuit is reduced.

46. The invention of claim 45, wherein the DC level shifting circuit comprises a balanced bridge, shunt nulling circuit.

47. The invention of claim 45, wherein the bias voltage provided by the biasing circuit comprises at least 48 volts.

48. The invention of claim 45 wherein the preamplifier circuit comprises a buffer and an amplifier downstream of the buffer.

49. The invention of claim 45 wherein said DC level shifting circuit DC couples the buffer to the amplifier.

50. The invention of claim 45 further comprising a condenser microphone DC coupled with the transducer input.

51. The invention of claim 46 wherein the DC level shifting circuit is operative to shift DC voltage in the signal path by an amount substantially equal to the bias voltage and opposite in polarity.

* * * * *